United States Patent [19]

Glaser et al.

[11] Patent Number: 5,457,593
[45] Date of Patent: Oct. 10, 1995

[54] APPARATUS FOR CONNECTING MULTI-WIRE TELECOMMUNICATION CABLING TO SURGE PROTECTOR MODULES

[75] Inventors: James A. Glaser, Bonham; Ronald W. Glaser, Ector, both of Tex.

[73] Assignee: ACT Communications, Inc., Ector, Tex.

[21] Appl. No.: 166,230

[22] Filed: Dec. 13, 1993

[51] Int. Cl.⁶ .................................................. H02H 9/00
[52] U.S. Cl. ............................... 361/119; 361/56; 361/91; 361/111; 361/118
[58] Field of Search .............................. 361/56, 91, 111, 361/118, 119, 127, 736, 728, 738, 753; 439/607, 620, 182

[56] References Cited

U.S. PATENT DOCUMENTS 4,658,327  4/1987  Hernandez ............................... 361/306
5,088,939  2/1992  Shepherd ................................. 439/620

Primary Examiner—Marc S. Hoff
Assistant Examiner—S. Jackson
Attorney, Agent, or Firm—Gregory W. Carr

[57] ABSTRACT

A protector block assembly for coupling a plurality of surge protectors to multi-line telecommunications cables includes a multi-layer printed circuit, to which has been mounted at least two cable connectors, and a protector block having a plurality of sockets for receiving standard surge protectors. A plurality of pins electrically and physically connects the multi-layer printed circuit board to the sockets on the protector block in a manner that a unique signal path exists between each lead in each connector and one of the sockets on the printed circuit board. The multi-layer printed circuit board includes traces on multiple layers that have a width and a copper content sufficient to carry current surges without breaking down.

21 Claims, 8 Drawing Sheets

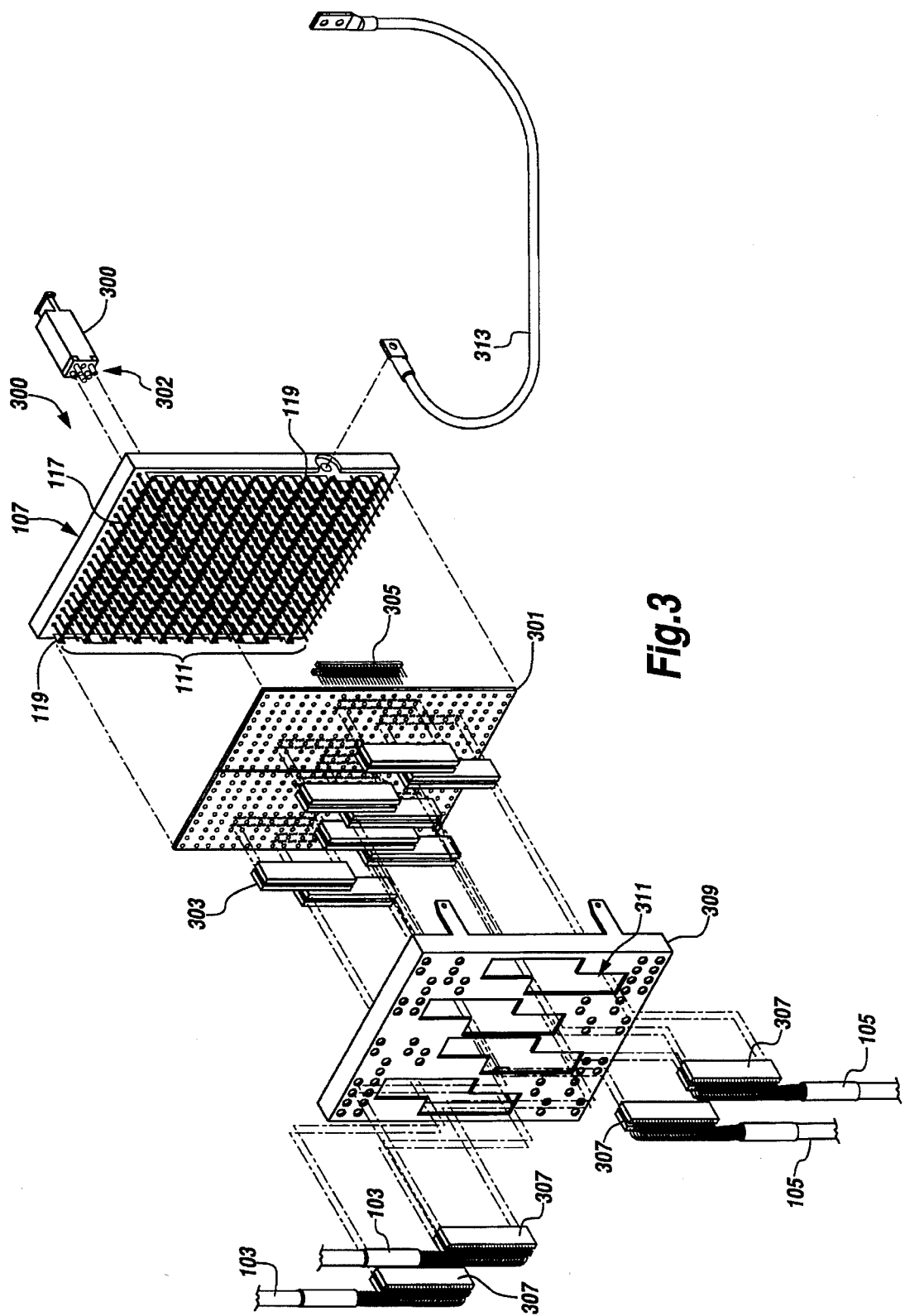

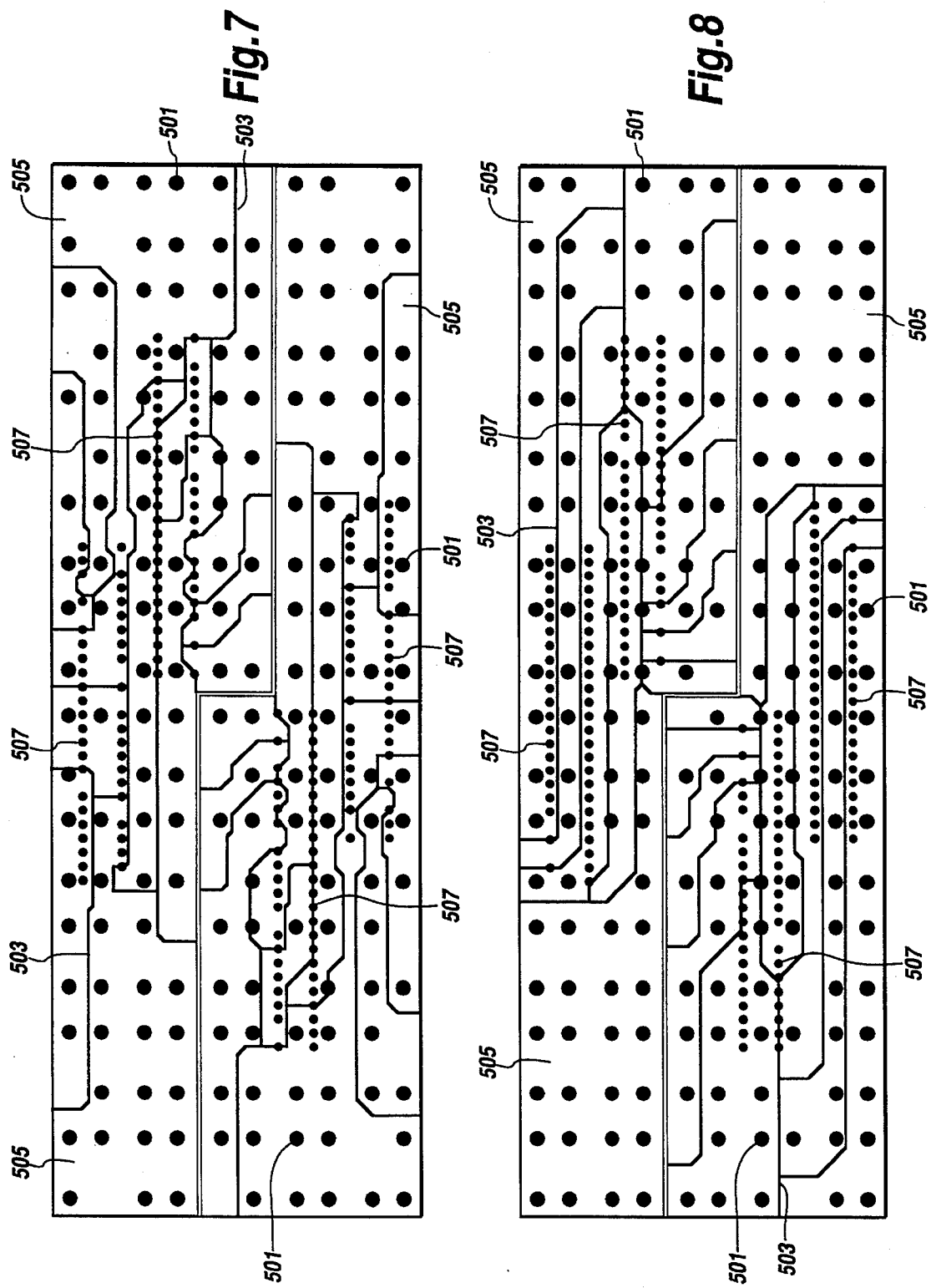

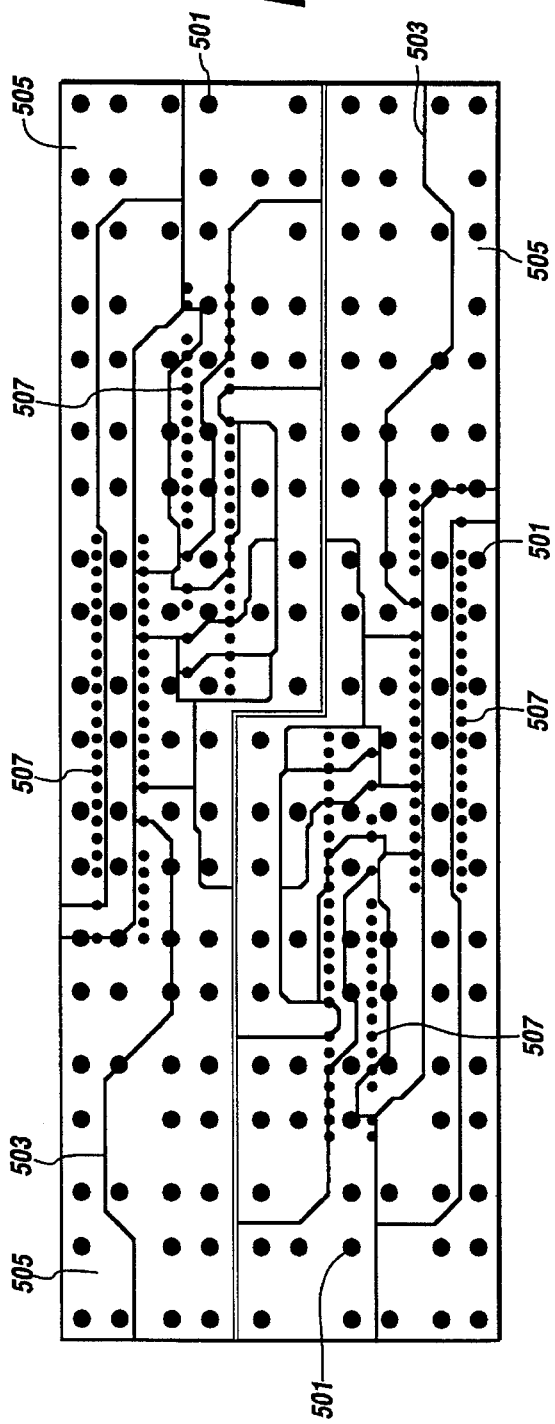
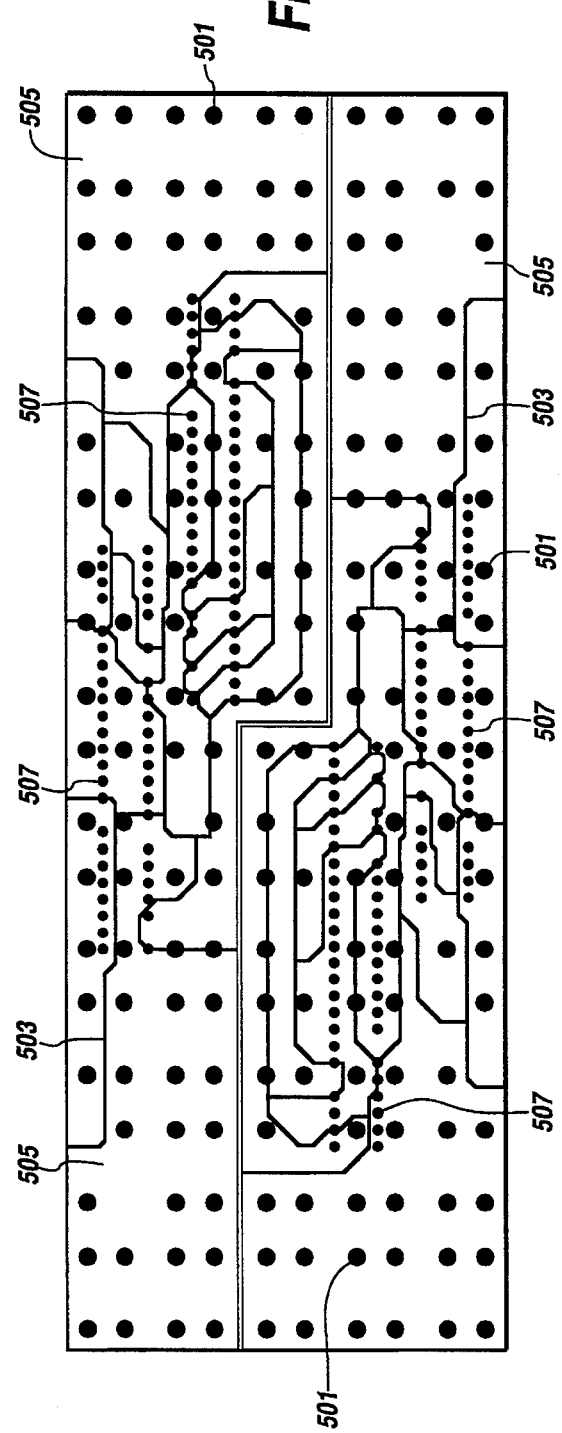

5,457,593

APPARATUS FOR CONNECTING MULTI-WIRE TELECOMMUNICATION CABLING TO SURGE PROTECTOR MODULES

FIELD OF THE INVENTION

The invention relates generally to surge protectors and to apparatus for connecting of multi-wire cabling to surge protectors.

BACKGROUND OF THE INVENTION

Surge protectors protect voltage sensitive equipment connected to electrical lines by discharging high voltage signals or current surges to ground before the high voltage signal can damage the equipment. Telecommunications systems employ very large numbers of surge protectors to connect voltage sensitive switching equipment and other equipment to outside phone lines. Phone lines, which normally carry relatively low voltage message signals, are subject to current surges caused by lightning and other extrinsic phenomena associated with the location of the phone lines.

Each phone line includes a pair of wires, referred to as the "tip" line and the "ring" line, that carry the message signal. Each tip and ring line is connected through an industry standard surge protector module having five pins: one for an incoming wire and one for an outgoing wire for each tip line; one for an incoming wire and one outgoing wire for each ring line; and one to connect to ground. The surge protector module passes low-voltage signals traveling between the incoming and outgoing wires for a given line, but discharges current surges on the line to the ground pin, which in turn is connected to ground.

Because of the large number of phone lines, connecting surge protectors to each of the lines is a labor intensive task. The conventional method for connecting the cables to the protector block has been to manually wire-wrap each line to the proper pin on the protector block. Wire wrapping involves cutting each conductor to a proper length, stripping the insulation off of each conductor and wrapping each conductor around the proper pin. Because phone lines are bundled together in cables, surge protectors are also bundled using a "protector block." A protector block in essence serves a function of providing a rigid structural platform for supporting a plurality of surge protector modules for coupling to multi-line telecommunications cables. Generally, protector blocks come in sizes that handle ten, twenty-five, fifty and one hundred surge protectors for coupling to an equal number of communication lines.

A protector block is fabricated as a single slab of plastic insulating material. On one side is a plurality of wire-wrap pins, one for each wire. On the opposite side, there is, for each wire-wrap pin, a female socket electrically connected to one wire wrap pin. The pins and the sockets are arranged in groups of five, with the pins in each group having predetermined configuration depending on the type of surge protector module being used. Each surge protector module has five pins that are inserted into the appropriate socket to establish a compression fit electrical connection with the socket and the wire-wrap pin.

After wire wrapping, cables are then anchored to an aluminum hood or shroud that extends over the pins of the protector block. The free-end of each cables is usually already fitted with a connector so that the entire assembly may be easily connected into a telecommunications system.

Wiring a protector block requires a significant amount of time and labor that limits production rates and generally increases the cost of assembly. As with any repetitive, manual process, quality control is a problem. Wiring mistakes occur and they must be found and then corrected, requiring more time and money. Sometimes a cable is bad or needs to be replaced because a different type of connector is needed to connect the cable to the system. A significant amount of time is required to unwrap the cable and rewrap a new cable.

SUMMARY OF THE INVENTION

The invention eliminates wire wrapping for protector block assemblies. Production time is thus reduced, labor costs minimized and quality is improved by eliminating wire wrapping errors. Cables are easily and quickly replaced. Furthermore, industry standard surge protector modules and protector blocks may be accommodated without modification if desired.

According to the invention, a protector block assembly includes a protector block, a multi-layer printed circuit board and at least two connector sockets mounted to this multi-layer printed circuit board. The multi-layer circuit board is electrically and physically joined to the protector block. The multi-layer circuit board includes a plurality of traces. Each trace uniquely couples the leads of each connector socket to a corresponding socket for a surge protector module pin on the protector block. The multiple layers of the printed circuit board permit use of traces that are sufficiently wide for conducting current surges without high resistance and to uniquely interconnect each connector lead to a predetermined protector block socket without crossing, while remaining relatively compact in size. The traces on the multilayer circuit board have an enhanced copper content to improve conductivity. In a preferred embodiment, the copper content of the metal laminate is at least 3 ounces per layer after etching.

Production rates for the invention are higher and the number of defects lower than the prior art wire wrapped protector blocks. The connector sockets allow easy connection and disconnection of incoming and an outgoing cables as needed.

Other advantages and objectives of the invention are described or will otherwise be apparent from the following description of the preferred embodiments of invention as illustrated in the accompanying drawings.

BRIEF DESCRIPTION OF THE DRAWINGS

FIG. 3 is an exploded view of one embodiment of a protector block assembly according to the present invention.

FIGS. 5 to 14 are schematic illustrations of metal patterns on, respectively, a component side, internal layers 1 to 8, and a solder side of a multi-layer printed circuit board illustrated in FIG. 3.

DETAILED DESCRIPTION OF THE PREFERRED EMBODIMENT

Figure 2:
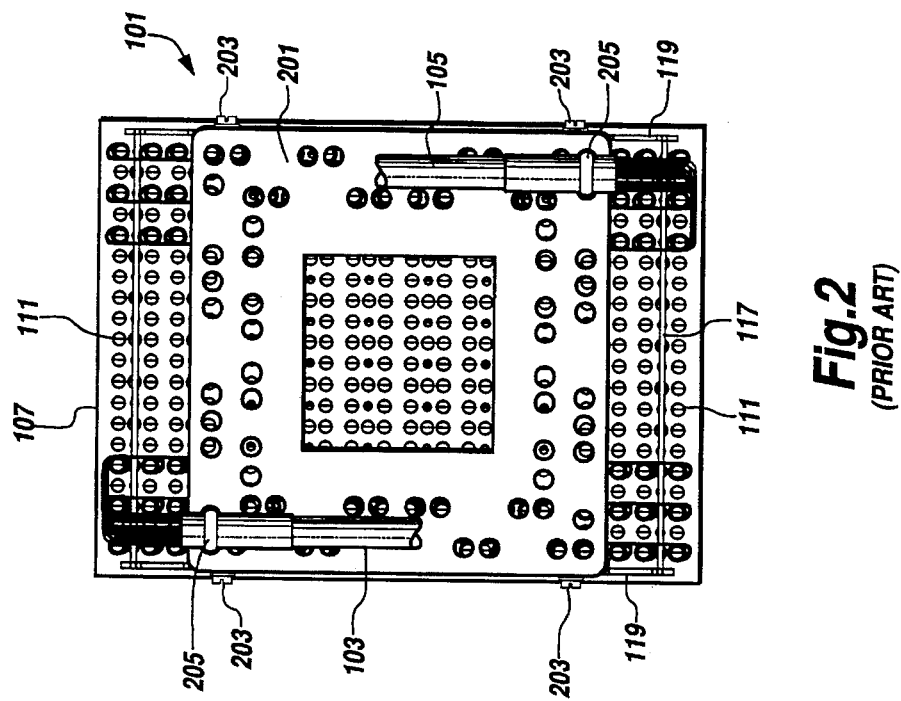
FIG. 2 is a plan view of the prior art protector block assembly of FIG. 1 showing cables anchored to a protective hood.
Figure 1:
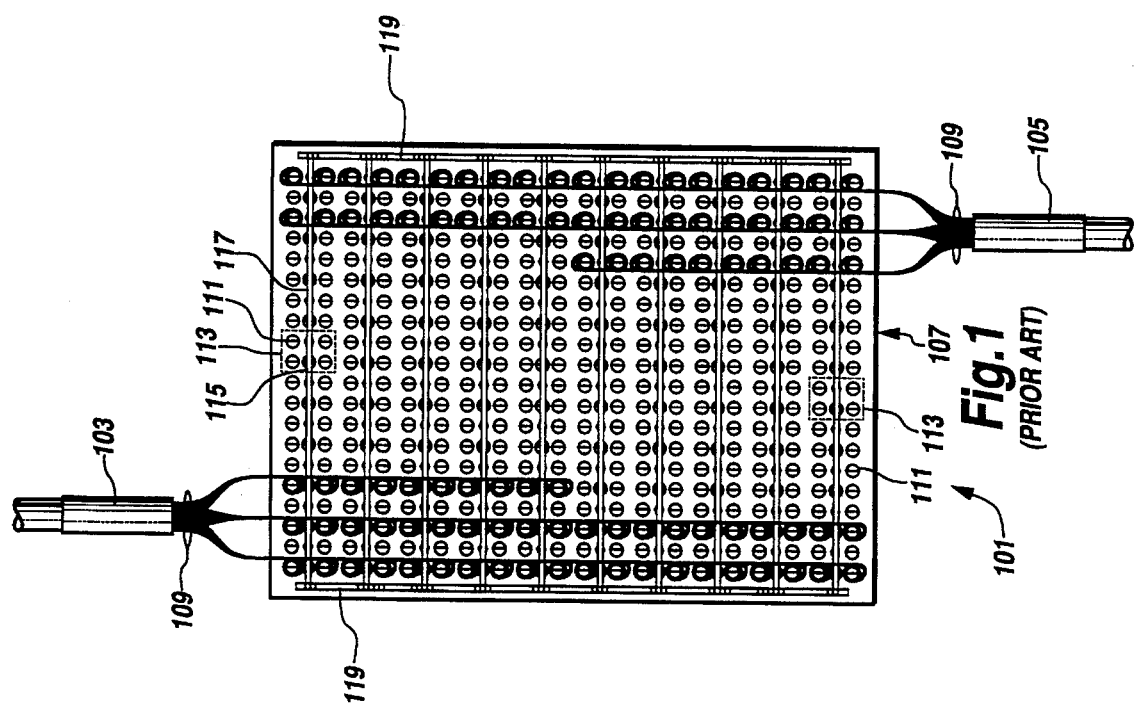
FIG. 1 is a plan view of a prior art protector block assembly, partially complete, showing wire-wrapping of cables to the protector block.

Referring to FIGS. 1 and 2, which illustrate a prior art protector block assembly 101 during two stages of assembly, an incoming cable 103 and an outgoing cable 105 are wire-wrapped to the protector block 107. Each cable includes a plurality of communication lines 109. In telephone systems, each communications line includes a pair of wires: one is designated the "tip" line and the other the "ring" line.

The base of protector block 107 is a rigid slab of plastic insulating material. Formed through the slab are a plurality of holes. Into each hole is inserted a metal socket that faces toward a rear side of the protector block (not seen). Each pin of a surge protector module (not shown) fits into on of these metal sockets and forms with the socket a compression fit to establish a good electrical connection. A plurality of surge protector modules (not shown) are similarly mounted to the sockets on the back of the protector block. Extending from each hole on a front side of the protector block is a wire-wrap pin 111 that is integrally formed with the metal socket.

In an industry standard configuration, a surge protector module has five pins, each connecting to one of the five following lines: incoming tip and ring; outgoing tip and ring; and ground. Five wire wrap pins 111 are grouped as indicated by dashed line 113 into a plurality of C shaped configurations. The configuration need not be C shape, since it depends solely on configuration of pins on the type of surge protector module being used. Within each configuration, the middle pin 115 is soldered to a transverse rail 117 that interconnects the ground pins on each row of five pin groupings. Each end of each transverse rail is electrically attached to a parallel side rails 119. One of the two side rails is connected with a screw to a 6 Awg stranded copper cable (not shown) to ground.

To couple the cables to the protector block, each tip and ring line for each communication line is segregated and then individually cut to an appropriate length, stripped and wrapped around a proper pin 111 according to a predetermined pin assignment. Referring now only to FIG. 2, once the cables are wire-wrapped to the protector block—note that additional cables are wire-wrapped to the protector block but have not been shown for clarity—an aluminum hood or shroud 201 is attached with screws 203 to the side rails 119. Each cable is then anchored to it using a strap 205. The free ends of cables 103 and 105 are each fitted with a connector for interconnection to the telephone system.

Referring now to FIG. 3, one embodiment of the invention includes a standard protector block 107 having a plurality of wire-wrap pins 111, grouped in standard five pin configurations, and ground rails 117 and 119. On a rear side 300 of the protector block are sockets (not seen) in which the pins of a plurality of surge protectors are received in a conventional manner. One surge protector 300 is shown being mounted and has five pins 302 in a standard configuration for insertion into sockets on the back of the protector block.

Mounted to the plurality of protector block pins 111 is a multi-layer printed circuit board 301. Except for the ground pins, each wire wrap pin 111 is inserted into a socket formed in the multi-layer circuit board. The socket is formed by a hole in the multi-layer printed circuit board that is plated with metal. The wire wrap pin is soldered in the socket to establish an electrical connection.

Mounted to a front side the multi-layer printed circuit board are a plurality of connector sockets 303. From side of the multi-layer printed circuit board, male or female connector pins 305 are inserted through sockets in the printed circuit board and extend into each cable connector socket 303. The connector pins are either soldered to the socket or are a compression fit pin. Each line in each cable 103 and 105 is connected to one connector pin in mating connector socket 307. Each connector socket 307 mates with a corresponding socket 303 on the multi-layer printed circuit board.

The multi-layer printed circuit board 301 is fabricated from multiple layers of dielectric material, such as fiberglass, bonded together. Each layer of the multi-layer printed circuit board is fabricated with a predetermined patterns of metal traces or "runs" using a conventional subtractive process. Briefly such a process involves cladding an laminate of conducting material on one surface of the printed circuit board layer. A layer of acid resist is printed onto the metal laminate in a pattern that is a negative of a desired pattern of metal traces. Exposed metal is then etched away with an acid, leaving the metal traces. Each layer is then affixed with the next adjacent layer or layers and bonded together. The metal laminate has an enhanced copper content so that at least 3 ounces remains in the laminate after etching for high conductivity.

Each metal trace provides a unique, low resistance electrical connection between one connector pin socket and one wire wrap protector block pin socket. The pattern of metal traces are determined such that the appropriate cable lines are electrically coupled to the appropriate pin on the surge protector module. In other words, a ring and tip line of an incoming communications line is coupled to the incoming tip and rings pins of the selected surge protector module. The outgoing ring and tip pins on the surge protector module are coupled to the outgoing ring and tip lines in the communication line of the outgoing cable corresponding to the line of the incoming cable.

The precise pattern of metal traces will depend, among other things, on the placement of the connector sockets, the connector pin assignments for the wires of the cables, and the number of surge protector modules. Because traces on single insulating layer cannot overlap or touch, multiple layers are required. Trial and error is used to optimize the metal trace patterns on each insulating layer to minimize the number of layers required for each design of a protector block assembly.

Aluminum hood 309 has cut into it rectangular holes 311 having dimensions slightly larger than mating connector 307 and through which they extend to connect connector sockets 303. When the hood is attached to protector block 107, the hood it acts to relieve strain on connector sockets 303 exerted by pulling on cables 103 and 105. One end of a six Awg stranded copper cable 31 3 is attached to ground rail by a screw and its other end is attached to ground.

Figure 4:
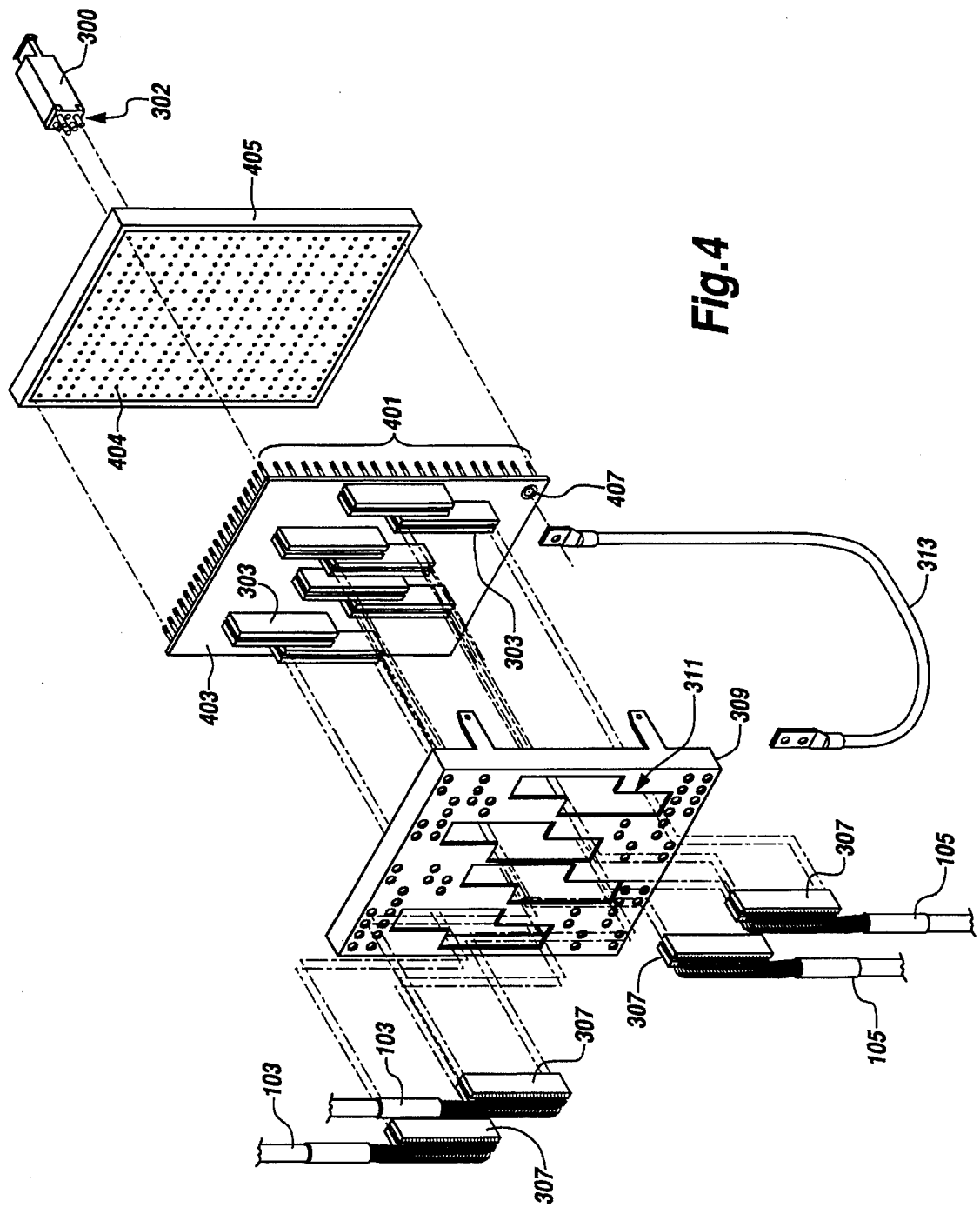
FIG. 4 is an alternate embodiment of a protector block assembly according to the present invention.
Figure 5:
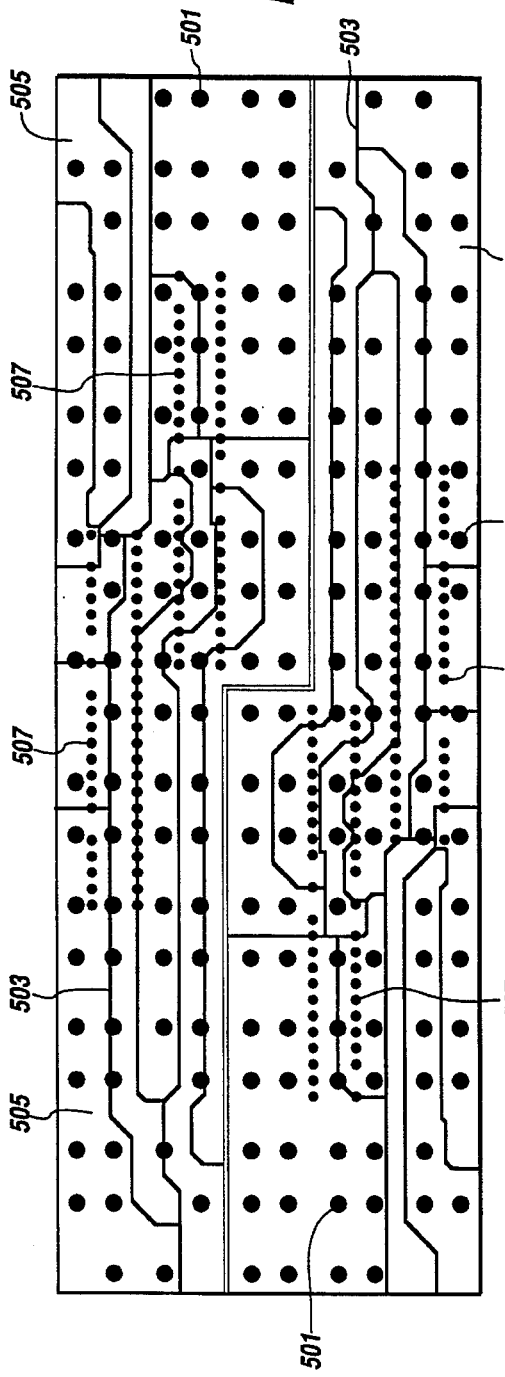
Figure 6:
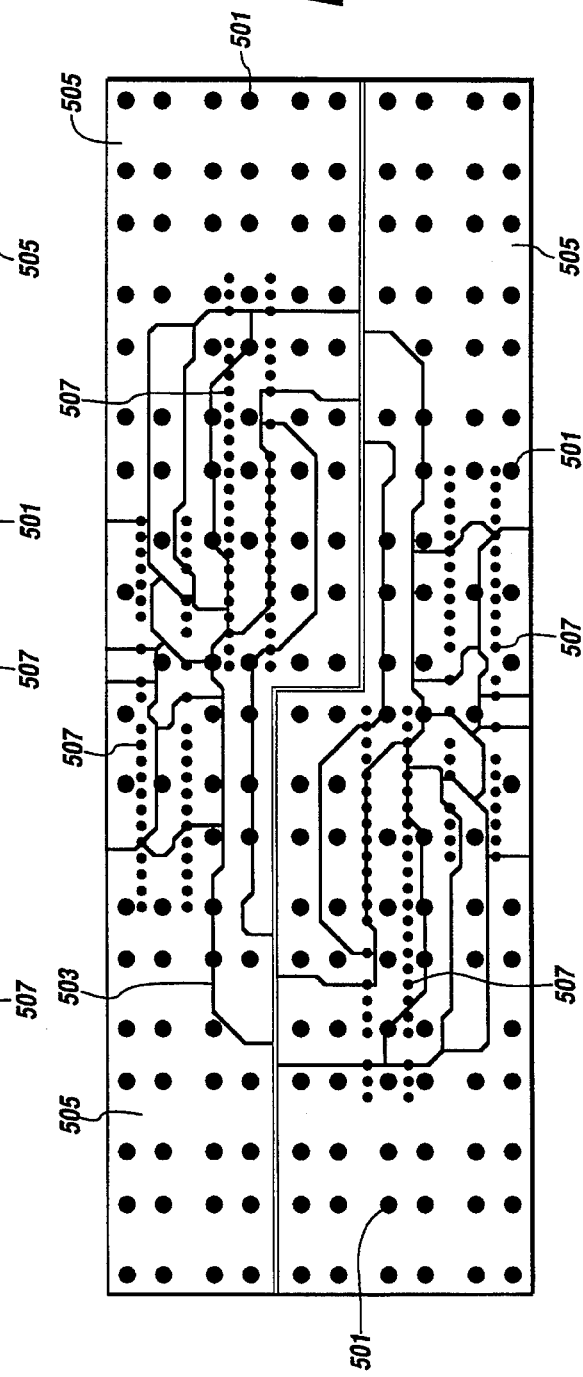
Figure 11:
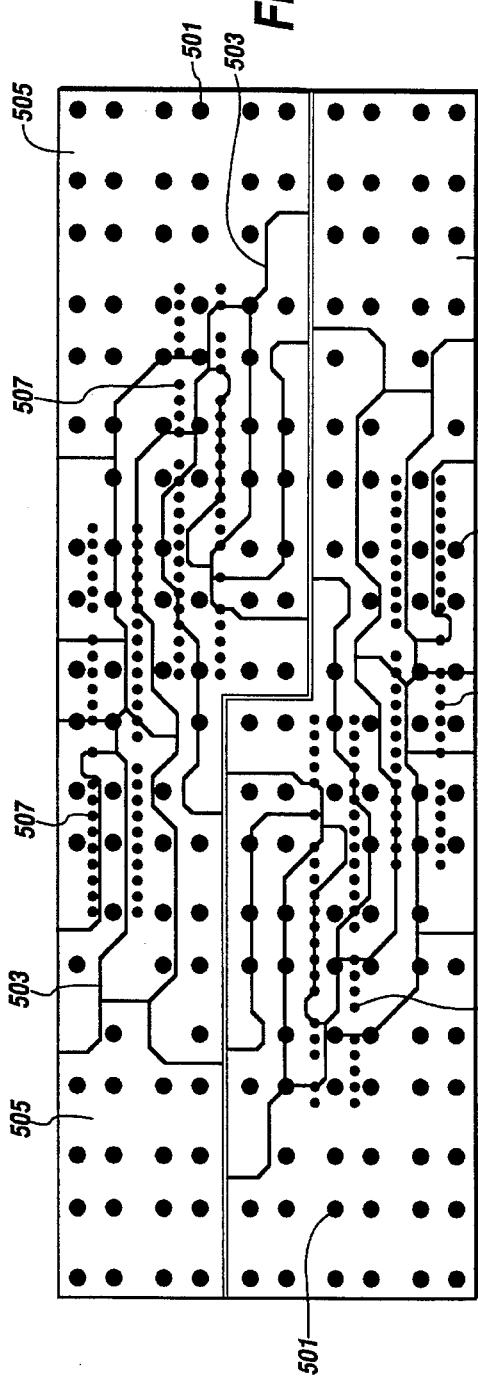
Figure 12:
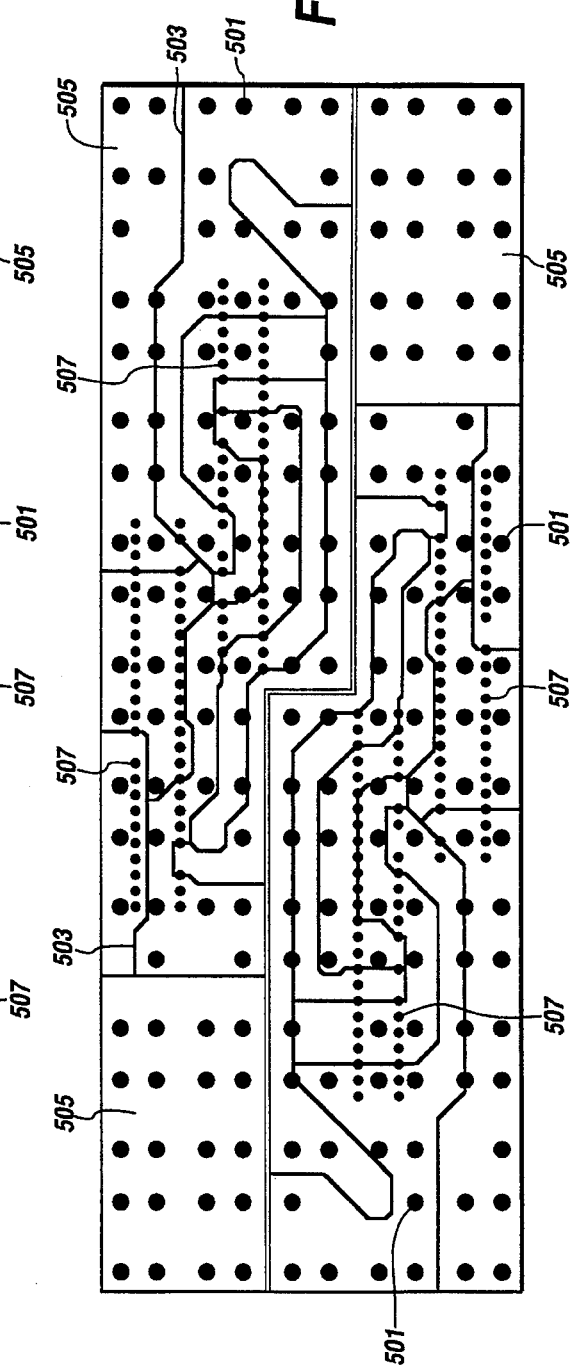
Figure 13:
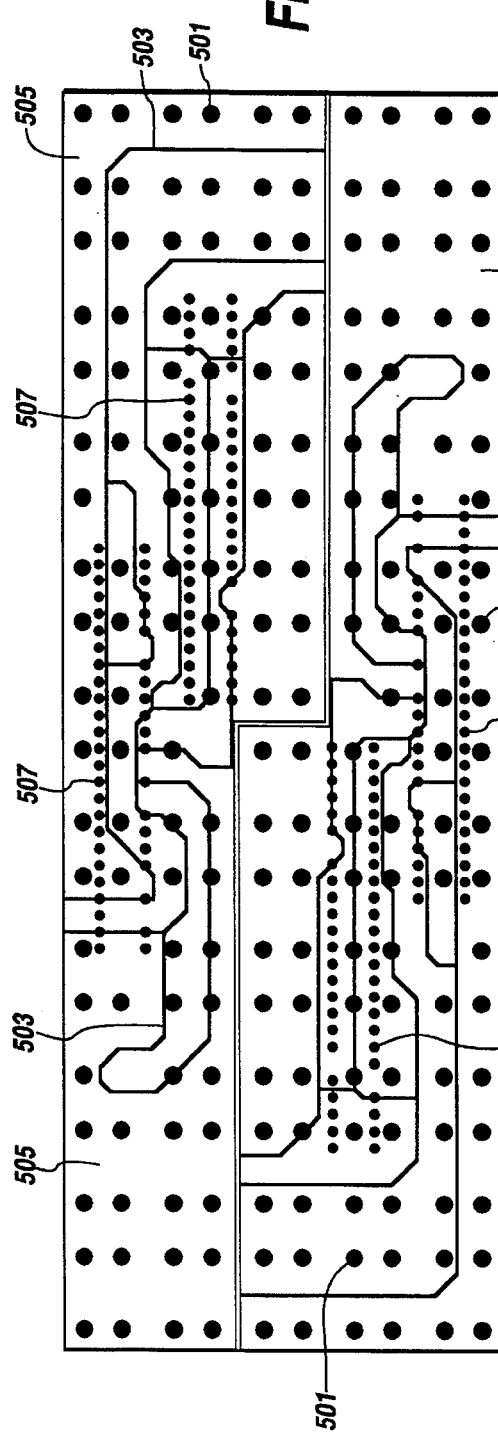
Figure 14:
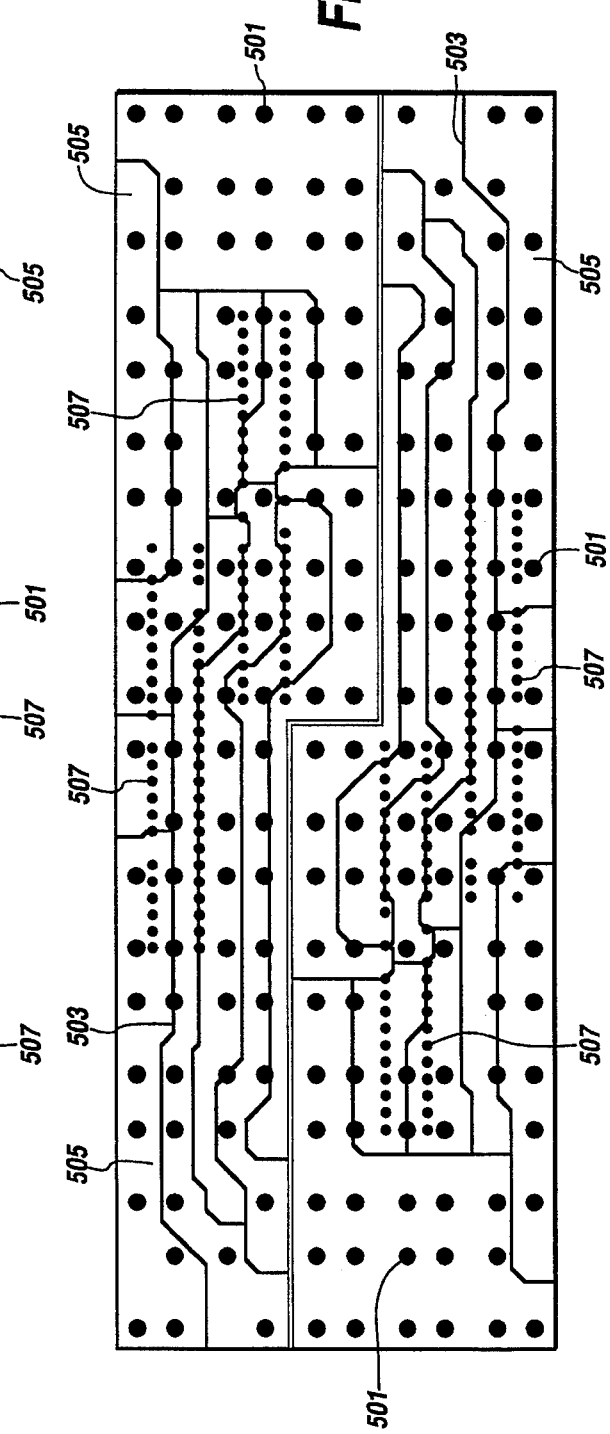

Referring now to FIG. 4, in an alternate embodiment of the invention, a multi-layer printed circuit board 403, similar to that of FIG. 3, has modified sockets for accepting female socket compression pins 401 instead of wire wrap pins. One end of each pin 401 is compression fitted into a socket on the printed circuit board 403. A compression fit eliminates the need for wave soldering the wire wrap pins and are loaded into the board by machine. The other end of each pin 401 has a female socket that is inserted into a corresponding hole 404 formed through in protector block 405 where the multi-layer printed circuit board and the protector block are assembled. These female sockets form on the back side of the protector block the sockets into which the pins of surge protector modules are fit. Connector sockets 303 are mounted to the multi-layer printed circuit board using connector pins in the manner shown in FIG. 3. Unlike the multi-layer circuit of FIG. 3, printed circuit board 403 includes traces or runs for connecting ground pins of the surge protector modules to ground connect socket 407, to which ground line 31 3 is attached.

In FIGS. 5 to 14 there is schematically illustrated layouts for a component-side layer, internal layers 1 to 8, and a solder-side layer, respectively, of the multi-layer printed circuit board 301. The layouts are for example only as the exact traces will depend on the type of connector sockets 303 and the number of incoming and outgoing lines. Drilled in the board 500 for each layer are a plurality of holes 501. These holes will form, when plated with metal, sockets for the connector pins 305 and wire wrap pins 111. Lines 503 indicate etch lines where metal is removed to define metal traces 505, which are between the lines. Note the traces are relatively wide to provide low resistance to high current surges without significant overheating that could lead to physical damage to the board. Preferably, the minimum width of each trace, with respect to the direction of current flow, is 0.15 inches. Dots 507 indicate placement of connector sockets 303.

Connector sockets 303 have the following pin assignments: 1 through 25.

The forgoing description of the preferred embodiments of the invention is for illustration and does not limit that scope of the invention. Modifications, substitutions and rearrangements of the described embodiment may be made without departing from the scope and spirit of the invention as set forth in the appended claims.

What is claimed is:

1. A surge protector assembly comprising:
   a protector block having a plurality of first sockets for receiving pins of a surge protector module;
   a first multi-line connector socket having a plurality of leads;
   a second multi-line connector socket having a plurality of leads;
   a multi-layer printed circuit board having a plurality of second sockets, the multi-layer printed circuit board having a first side on which is mounted the first and second connector sockets, the multi-layer circuit board having a plurality of layers and having a plurality of traces printed on said layers for establishing between each lead of each of the first and second connectors and one of the plurality of second sockets in the multi-layer printed circuit board a unique electrical connection; and
   a plurality of pins, each pin extending between and electrically connecting each one of the plurality of second sockets in the multi-layer printed circuit to one of the plurality of first sockets in the protector block, thereby providing a unique signal path between each lead of the plurality of connector socket leads and predetermined one of said first sockets.

2. The assembly of claim 1 wherein each of the traces on the multi-layer printed circuit board has a width sufficient to conduct a high current surge.

3. The assembly of claim 1 wherein the plurality metal traces have an enhanced copper content such that there is substantially three ounces of copper on each layer of the multi-layer printed circuit.

4. The assembly of claim 1 wherein the plurality of pins are compression fit pins having a female socket inserted into holes defined through the protector block, the female sockets forming the plurality of sockets into which pins of surge protector modules are inserted.

5. The assembly of claim 1 further including an aluminum hood overlaying the multi-layer printed circuit board and connected to the protector block, the hood including holes for supporting cable connectors for relieving strain on the incoming and outgoing cables.

6. The assembly of claim 1 wherein the plurality of pins are wire wrap pins that are formed on the protector block and electrically connected to the sockets on the protector block, and that are inserted into the sockets formed in the multi-layer circuit board.

7. The assembly of claim 6 each wire wrap pin is soldered to the printed circuit board.

8. A surge protector assembly comprising:
   a protector block having a plurality of first sockets for receiving pins of a surge protector module;
   a plurality of surge protector modules loaded onto the protector block;
   a first multi-line connector socket having a plurality of a first multi-line cable having at one end a first mating connector socket for connecting to the first connector socket and establishing a connection between each line in the cable and one lead of the first plurality of leads;
   a second multi-line connector socket having a plurality of leads;
   a second multi-line cable having at one end a second mating connector socket for connecting to the first connector socket to establish a connection between each line in the cable and one lead of the second plurality of leads;
   a multi-layer printed circuit board having a plurality of second sockets, the multi-layer printed circuit board having a first side on which is mounted the first and second connector sockets, the multi-layer circuit board having a plurality of layers and having a plurality of traces printed on said layers for establishing between each lead of each of the first and second connectors and one of the plurality of second sockets in the multi-layer printed circuit board a unique electrical connection; and
   a plurality of pins, each pin extending between and electrically connecting each one of the plurality of second sockets in the multi-layer printed circuit to one of the plurality of first sockets in the protector block, thereby providing a unique signal path between each line in each of the first and second multi-line cables and a predetermined one of the pins of a surge protector module.

9. The assembly of claim 8 wherein each of the traces on the multi-layer printed circuit board has a width sufficient to conduct a high current surge.

10. The assembly of claim 8 wherein the plurality metal traces have an enhanced copper content such that there is substantially three ounces of copper on each layer of the multi-layer printed circuit.

11. The assembly of claim 8 wherein the plurality of pins are compression fit pins having a female socket inserted into holes defined through the protector block, the female sockets forming the plurality of sockets into which pins of surge protector modules are inserted.

12. The assembly of claim 8 further including an aluminum hood overlaying the multi-layer printed circuit board and connected to the protector block, the hood including holes for supporting cable connectors for relieving strain on the incoming and outgoing cables.

13. The assembly of claim 8 wherein the plurality of pins are wire wrap pins that are formed on the protector block and electrically connected to the sockets on the protector block, and that are inserted into the sockets formed in the multi-layer circuit board.

14. The assembly of claim 13 each wire wrap pin is soldered to the printed circuit board.

15. An apparatus for coupling a telecommunications cable to a plurality of circuits comprising:

a solid, generally planar block having a front side, for supporting a plurality of spaced-apart electrical connectors in a predetermined pattern, each electrical connector extending through the block to a back side of the block for permitting an electrical connection to be established with the connector from the back side of the block;

a multi-layer printed circuit board having back and front sides; the multi-layer printed circuit board including a plurality of sockets open to the front side and having a pattern substantially corresponding to the predetermined pattern of electrical connectors on the block, and first and second cable connectors mounted to the back side of the printed circuit board, each cable connector having a plurality of leads; the multi-layer circuit board further including a plurality of layers and a plurality of traces printed on said layers for establishing an electrical connection from each lead of the first and second cable connectors to one of the plurality of sockets in the multi-layer printed circuit board; and a pin extending from each socket on the front side of the printed circuit board to a corresponding electrical connector on the back side of the block for electrically connecting each one of the plurality of sockets in the multi-layer printed circuit to a corresponding one of the plurality of electrical connectors in the block, thereby providing a unique signal path between each one of the plurality of sockets and its corresponding electrical connector.

16. The apparatus of claim 15 wherein each of the traces on the multi-layer printed circuit board has a width sufficient to conduct a high current surge.

17. The apparatus of claim 15 wherein the plurality metal traces have an enhanced copper content.

18. The apparatus of claim 15 wherein each of the plurality of pins includes a compression fit pin having a pin section connected to a female socket, the female socket being inserted into a hole defined through the block thereby forming each one of the plurality of electrical connectors and corresponding pin, each pin section then being inserted into its corresponding socket on the front of the printed circuit board during assembly of the apparatus.

19. The apparatus of claim 15 further including an aluminum hood overlaying the back side of multi-layer printed circuit board and connected to the block, for supporting cables connected to the first and second cable sockets to relieve strain on the connector sockets.

20. The apparatus of claim 15 wherein each of the plurality of pins is a wire wrap pin integrally formed with its corresponding electrical connections on the block, and wherein a free end of each wire wrap pin is inserted into its corresponding socket on the front side of the printed circuit board during assembly of the apparatus.

21. The apparatus of claim 20 each wire wrap pin is soldered to a socket on the printed circuit board.

* * * * *

UNITED STATES PATENT AND TRADEMARK OFFICE
CERTIFICATE OF CORRECTION

PATENT NO.   : 5,457,593
DATED        : October 10, 1995
INVENTOR(S)  : James A. Glaser; Ronald W. Glaser Page 1 of 1

It is certified that error appears in the above-identified patent and that said Letters Patent is hereby corrected as shown below:

Column 3,
Line 54, delete "300" insert -- 304 --

Column 6,
Line 20, after "of" insert -- leads; --
Line 20, before the third "a" create a new paragraph
Line 28, delete "first" insert -- second --

Drawings,
Sheet 2, Fig. 3, the reference numeral 300, pointing to the rear of reference 107, should read 304.

Signed and Sealed this

Twenty-third Day of October, 2001

Attest:

*Nicholas P. Godici*

NICHOLAS P. GODICI
*Attesting Officer*   *Acting Director of the United States Patent and Trademark Office*